the US Patent

United States Patent [19]
Ball et al.

[11] 4,398,159
[45] Aug. 9, 1983

[54] SWITCH MODE - CLASS B POWER AMPLIFIER

[75] Inventors: Edward T. Ball, Coquitlam; John E. R. White, Port Moody, both of Canada

[73] Assignee: AEL Microtel, Ltd., Burnaby, Canada

[21] Appl. No.: 262,241

[22] Filed: May 11, 1981

[51] Int. Cl.³ .......................... H03F 3/26; H03F 3/45
[52] U.S. Cl. ................................. 330/262; 330/260; 330/207 R
[58] Field of Search ............... 330/146, 1 R, 3, 262, 330/260, 251, 207 A, 207 R, 250

[56] References Cited
U.S. PATENT DOCUMENTS
3,990,020 11/1976 Porter ................................. 330/146

Primary Examiner—James B. Mullins
Assistant Examiner—Gene Wan
Attorney, Agent, or Firm—Leonard R. Cool

[57] ABSTRACT

An input signal is applied to the inverting input of a class B amplifier and to the input of a limiter circuit. The square wave signal from the limiter is applied to the input of a switching amplifier which drives this amplifier between V and ground at the switching rate established by the input signal; thereby, obtaining a power control signal. The power control signal is applied to one terminal of a load and to the non-inverting input of said class B amplifier. Ignoring the input signal to the amplifier, this switches the output of the class B amplifier between V and ground at the same rate and in phase with the output from the switching amplifier. The gain of the input signal path in the amplifier is such that the input signal will just drive the output between V and ground. The switching action of the power control signal in combination with the input signal then causes the output signal across the load to have the same characteristic as the input signal but with a peak-to-peak amplitude of 2V.

5 Claims, 4 Drawing Figures

SWITCH MODE - CLASS B POWER AMPLIFIER

BACKGROUND OF INVENTION

1. Field of Invention

This invention relates to power amplifiers and in particular to such amplifiers which are designed to operate into a low impedance, at a low frequency, and at a relatively high supply voltage.

2. Background Description

Amplifiers such as are disclosed in the instant application may be used in many different circuits and applications; however, only its use in a ringing generator will be discussed in detail here, as this was the device shosen for the reduction to practice. It is to be understood that other uses would easily come to mind.

A ringing generator supplies the ringing signal over telephone lines from a central office to a subscriber's telephone set in order to operate the ringer located therein. Typically, the ringing voltage is in the order of 90 V rms, 20 or 25 Hz signal which operates into a low impedance offered by the combination of a plurality of telephone lines and telephone set ringers. Because the ringing generator chosen will be called upon to supply ringing power to a given number of telephone sets at the same time, this ringing generator is capable of supplying about 15 watts continuously. However, this power level does not represent a constraint upon the output power. A number of different techniques have been used in the past to generate the ringing signal.

One such technique is to use the classic self-oscillating power inverter configuration. A disadvantage of this type of device is that it delivers a squar wave signal and at a fixed frequency. Other techniques include the straight class B amplifier which gives good efficiency but requires twice the peak-to-peak current as is required by the instant invention; and the class B amplifier bridge, which reduces the current requirement but is less efficient than the configuration of the instant invention. These latter two circuits will be considered in more detail and compared with that of the instant invention under the description of the invention.

SUMMARY OF INVENTION

An amplifier configuration which provides a driving voltage to a load which has the same characteristic as the input signal, but has a peak-to-peak amplitude that is twice the supply voltage comprises: a first circuit responsive to the input signal to derive a first square wave switching signal synchronous with said input signal; a second circuit responsive to said switching signal to provide a power control signal having alternate amplitude states of the maximum supply voltage and ground at the output thereof; and a third circuit combining said input signal with said power control signal so as to provide a load driving voltage between the output terminals of said second and third circuits having a peak-to-peak amplitude which is twice the peak amplitude of the supply voltage.

DESCRIPTION OF DRAWING(S)

DETAILED DESCRIPTION OF INVENTION

Figure 1:
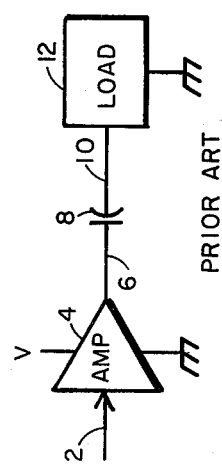
FIG. 1 is a block diagram of a class B power amplifier as used in the prior art.

Referring now to FIG. 1, it may be seen that an input signal on path 2, which signal may be sinusoidal in form, is applied to the input of the class B amplifier 4. This figure illustrates a conventional approach to coupling power into a load from a class B amplifier and it should be noted that the stage is powered between ground and a single power supply rail having a potential V. This single-ended voltage supply configuration requires a DC blocking capacitor 8 to keep the direct current from flowing in the load 12 since the class B output stage is biased at V/2. In order that the power developed by the amplifier be efficiently coupled to the load, the reactance of the capacitor must be much less than the load impedance. The resistance of the load i.e., for ringing generators, is generally of a low value in the order of 2 ohms and the reactance of the capacitor should be approximately one-tenth of this value, i.e., approximately 0.2 ohms. For a 20 Hz signal, the value of the capacitor 8 will then be in the order of 40,000 microfarad and with a voltage rating of 60 volts (necessary since the supply voltage V may be as high as −56 volts in telephone operations) a case size for such a capacitor is in the order of 3 inches in diameter by 5-⅜ inches long. An advantage of this configuration is that the efficiency may be shown to be in the order of 78%. The disadvantage, as noted previously, is that the current required is about twice that for the bridge configuration.

Figure 2:
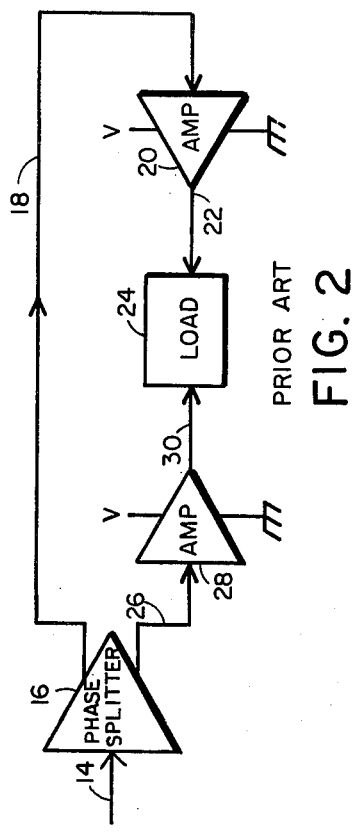
FIG. 2 is a block diagram of a class B bridge configuration of the prior art.

FIG. 2 shows a typical class B bridge configuration. This approach is used because it eliminates the capacitor required by the class B amplifier configuration shown in FIG. 1 and it drives the load with a peak-to-peak value of twice the power supply voltage. This is an additional advantage over the circuit of FIG. 1 as the load current is now one-half the value required in FIG. 1 for the same power delivered to the load. This eases component-handling specifications. However, the theoretical efficiency of the bridge circuit shown in FIG. 2 is in the order of 61%.

Figure 4:
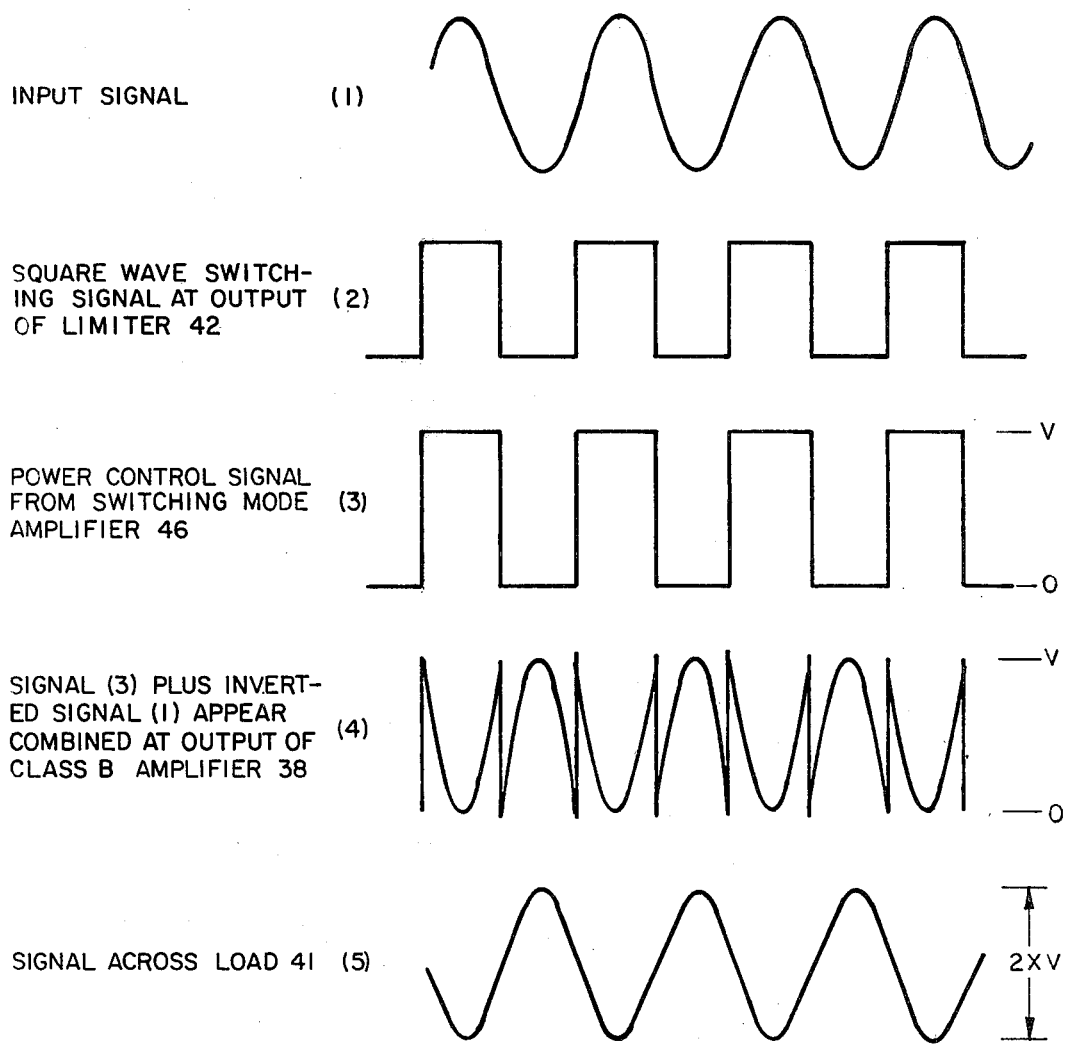
FIG. 4 is a waveform diagram which depicts the waveforms occurring at various points in the circuit of FIG. 3.

The switch mode—class B amplifier configuration of the instant invention permits driving a load impedance with a signal that has a peak-to-peak amplitude of twice the supply voltage and it can be shown that it operates with a theoretical efficiency equal to that of the conventional class B amplifier configuration shown in FIG. 1. In this case, it may be seen that the load is driven at one end by a class B amplifier and a switch mode amplifier is used at the opposite end of the load. The input signal is applied to path 32 and the input signal is shown as a sinusoidal waveform in FIG. 4. It should be noted that the input signal need not be of that format, but could be of another form, a sinusoidal waveform has been shown for illustrative purposes only. This input signal is applied to the inverting input of the class B amplifier 38 and is also applied via path 40 to the input of limiter 42. Limiter 42 converts the input signal into a square wave switching signal as shown at waveform 2, FIG. 4, and this switching signal is applied via path 44 to the input of switching amplifier 46, causing it to switch between V and ground in synchronism with the input square wave switching signal from limiter 42. This provides a power control signal as shown at waveform 3, FIG. 4, which switches between ground or zero potential and the supply voltage V. The output of switching amplifier 46 is applied via path 48 to one input of load 41 and via junction 50 and path 52 to the non-inverting input of class B amplifier 38. Assuming the input signal is blocked from the amplifier, then, the switching signal from limiter 44, as applied to switching amplifier 46, causes both ends of the load 41 to be switched up and down together synchronously, and in phase, between the power supply voltage V and ground. Because both ends of the load are switched synchronously and in phase, there is no signal caused by this operation to be developed across load 41.

Figure 3:
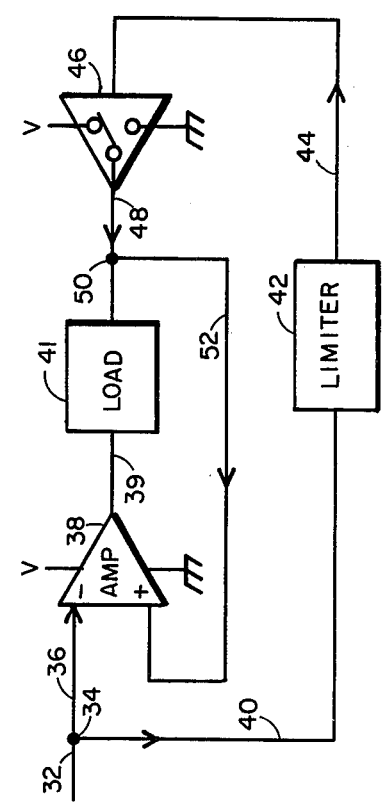
FIG. 3 is a block diagram of the amplifier configuration of a preferred embodiment of the instant invention.

As noted above, however, the input signal is applied to the inverting input of the class B amplifier. This input signal and the power control signal are thereby combined. The gain of the input signal path in the amplifier 38 is adjusted such that the zero to peak value of the input signal will just drive the output between V and ground. This combined effect is shown in waveform 4 of FIG. 4. As may be seen from the waveform diagram, the power control signal is in phase with the input signal and synchronous therewith so that during the time period when both ends of the load, i.e., paths 39 and 48 are at the V potential, the output signal will pass from V to zero and back to V. On the alternate cycle, the reverse will occur and thus the peak-to-peak output voltage will be 2 V as is shown in waveform 5 of FIG. 4. Thus, the output voltage and reduced current as is obtained by the bridge configuration of class B amplifiers, as illustrated in FIG. 2, is obtained by the amplifier configuration of FIG. 3, but, by use of the switch mode amplifier 46, the theoretical efficiency of the circuit shown in FIG. 3 is essentially the same as that for the single class B amplifier as is shown in FIG. 1, i.e., approximately 78%.

While the invention has been particularly shown and described with reference to a preferred embodiment, it will be understood by those skilled in the art that change in form and detail may be made therein without departing from the spirit and scope of the invention.

What is claimed is:

1. An amplifier configuration, which operates at the theoretical efficiency of a class B amplifier, for amplification of an input signal to be applied to a load, comprising:
   a power source for providing a power supply voltage of V between one output terminal and a ground potential;
   a first circuit responsive to said input signal for deriving a square wave switching signal synchronous with said input signal;
   a second circuit responsive to said square wave switching signal to provide a square wave power control signal having alternate amplitude states of the voltage V and ground at an output terminal that is connected to one side of the load; and
   a third circuit having first and second input terminals receiving the input signal and the control signal, respectively, and having an output terminal connected to the other side of the load; said third circuit being responsive to said power control signal to alternately provide said V voltage and ground at the output terminal thereof when the input signal is blocked from said first input terminal, the output of said third circuit then being in phase with that of said second circuit whereby no signal is developed therebetween; said third circuit being responsive to the application of said input and control signals thereto so as to provide amplification of said input signal such that the zero to peak value of the input signal will drive the output thereof between one of V and ground and the inverse thereof for alternate states of said switching signal; whereby a load driving voltage is obtained between the output terminals of said second and third circuits that has a peak-to-peak amplitude of twice the supply voltage V.

2. An amplifier configuration as set forth in claim 1 wherein said first circuit comprises a limiter for generation of said square wave switching signal.

3. An amplifier configuration as set forth in claim 2 wherein said second circuit comprises a switching amplifier providing an output switched between V and ground.

4. An amplifier configuration as set forth in claim 1 or 3 wherein said third circuit comprises a class B transistor amplifier connected to the power supply V and ground terminals of said power source, said amplifier having a non-inverting input adapted to receive said power control signal and an inverting input connected to receive said input signal.

5. An amplifier configuration which operates at the theoretical efficiency of a class B amplifier, for amplification of an input signal that is to be applied to a load having one and other terminals thereof, comprising:
   a power source for providing a power supply voltage of voltage V at one output terminal and having an other output terminal connected to ground;
   a limiter circuit having an input adapted to receive said input signal and to provide a square wave switching signal at its output, said switching signal being synchronous with the input signal;
   a switching amplifier having an output connected to one terminal of the load; and having its input adapted to receive said synchronous square wave switching signal and being responsive thereto to alternately provide at its output the voltage of V and ground; and
   a class B amplifier having an output connected to the other terminal of the load, having an inverting input connected to receive said input signal, and having a non-inverting input connected to receive the power control signal V and ground conditions as they appear at the output of said switching amplifier, so that the output of the class B amplifier is also driven between ground and V when the input signal is absent, thereby switching both terminals of the load to the V or ground potential synchronously;
   whereby the input signal drives the load with a signal that has a peak-to-peak amplitude of twice the supply voltage V.

* * * * *